United States Patent [19]

Saban et al.

[11] Patent Number: 5,438,300
[45] Date of Patent: Aug. 1, 1995

[54] DIGITAL FREQUENCY MULTIPLIER UTILIZING DIGITAL CONTROLLED OSCILLATOR

[75] Inventors: Rami Saban, Holon; Avner Efendovich, Jerusalem; Varda Karpati, Netanya, all of Israel

[73] Assignee: National Semiconductor Corporation, Santa Clara, Calif.

[21] Appl. No.: 221,736

[22] Filed: Apr. 1, 1994

[51] Int. Cl.[6] .................... H03L 7/099; H03L 7/18; H03B 5/24

[52] U.S. Cl. .................... 331/16; 331/1 A; 331/17; 331/34; 331/57; 327/107; 360/51; 455/260

[58] Field of Search ............ 331/1 A, 10, 11, 16, 331/17, 18, 34, 57; 360/51; 327/270, 276, 277, 278, 279, 280, 281, 282, 283, 284, 105–107, 237–253, 291–305; 455/260

[56] References Cited

U.S. PATENT DOCUMENTS

| | | | |
|---|---|---|---|
| 4,472,818 | 9/1984 | Zapisec | 375/110 |
| 4,584,695 | 4/1986 | Wong et al. | 375/81 |
| 4,633,488 | 12/1986 | Shaw | 375/120 |
| 4,641,048 | 2/1987 | Pollock | 327/284 X |
| 4,742,403 | 5/1988 | Troletti | 360/45 |
| 4,796,280 | 1/1989 | Nesin et al. | 375/110 |
| 5,015,970 | 5/1991 | Williams et al. | 331/27 X |
| 5,087,842 | 2/1992 | Pulsipher et al. | 327/284 X |
| 5,148,113 | 9/1992 | Wight et al. | 327/237 X |
| 5,216,301 | 6/1993 | Gleeson, III et al. | 307/595 |
| 5,243,227 | 9/1993 | Gutierrez, Jr. et al. | 327/281 X |
| 5,257,294 | 10/1993 | Pinto et al. | 331/34 X |
| 5,331,294 | 7/1994 | Watanabe et al. | 331/34 X |
| 5,349,311 | 9/1994 | Mentzer | 331/57 |
| 5,382,921 | 1/1995 | Estrada et al. | 331/57 X |

OTHER PUBLICATIONS

L. A. Laurich et al., "Phase Lock Loop With Delay Line Oscillator", IBM Technical Disclosure Bulletin, vol. 13, No. 7, pp. 1863–1864, Dec. 1970.
L. A. Laurich, "Phase Lock Loop With Variable Delay Line Oscillator", IBM Technical Disclosure Bulletin, vol. 13, No. 7, pp. 1861–1862, Dec. 1970.
J. Sonntag et al., "A Monolithic CMOS 10MHz DPLL for Burst-Mode Data Retiming", ISSCC Dig. Tech. Papers. pp. 194–195, Feb. 16, 1990.
B. Kim et al, "A 30-MHz Hybrid Analog/Digital Clock Recovery Circuit in 2-$\mu$m CMOS", IEEE Journal of Solid-State Circuits, vol. 25, No. 6, pp. 1385–1394, Dec. 1990.
M. Bazes et al., "A Novel CMOS Digital Clock and (List continued on next page.)

*Primary Examiner*—David Mis
*Attorney, Agent, or Firm*—H. Donald Nelson; David E. Steuber; Richard J. Roddy

[57] ABSTRACT

A frequency multiplier includes a ring oscillator having a number of logic gates arranged in a plurality of rings. Control inputs enable the selection of individual gates so as to connect them into the ring or, conversely, remove them from the ring. As additional gates are removed, the combined delay imposed by the gates remaining in the ring is reduced and the frequency of the oscillator increases. A variable delay element, preferably a group of tri-state inverters connected in parallel, is connected between two of the gates. The oscillator is fine tuned by controlling the delay inserted by the variable delay element. The frequency multiplier also includes a frequency comparator. A reference frequency is passed through a divide-by-K unit and the output of the ring oscillator is passed through a divide-by-N unit, N being greater than K. The frequency multiplier is coarse-tuned by progressively removing additional gates from the ring oscillator, and then fine-tuned by increasing the delay imposed by the variable delay element. At the conclusion of coarse and fine tuning, the frequency multiplier is locked at a frequency which closely approximates a reference frequency multiplied by N/K. An accuracy of 1% or less may be achieved. When the frequency multiplier ceases to be hooked on a frequency, it enters an idle state in which it consumes no power.

17 Claims, 6 Drawing Sheets

OTHER PUBLICATIONS

Data Decoder", IEEE Journal of Solid–State Circuits, vol. 27, No. 12, pp. 1934–1940, Dec. 1992.

S. Miyazawa et al., "A BiCMOS PLL–Based Data Separator Circuit with High Stability and Accuracy", IEEE Journal of Solid–State Circuits, vol. 26, No. 2, pp. 116–121, Feb. 1991.

T. H. Lee et al., "A 155–MHz Clock Recovery Delay–and Phase–Locked Loop", IEEE Journal of Solid–State Circuits, vol. 27, No. 12, pp. 1736–1746, Dec. 1992.

F. Lu et al., "A 700–MHz 24–b Pipelined Accumulator in 1.2–μm CMOS for Application as a Numerically Controlled Oscillator", IEEE Journal of Solid–State Circuits, vol. 28, No. 8, pp. 878–885, Aug. 1993.

*Floppy Disk Data Separator Design Guide for the DP8473*, Application note No. 5, National Semiconductor Corporation, pp. 1–29, 1989 Lit, #100505 (no month, author).

DIGITAL FREQUENCY MULTIPLIER UTILIZING DIGITAL CONTROLLED OSCILLATOR

REFERENCE TO RELATED APPLICATION

This application is related to application Ser. No. 08/221,618, filed on the same date as this application, which is incorporated herein by reference in its entirety.

FIELD OF THE INVENTION

This invention relates to frequency multipliers and, in particular, a fully digital frequency multiplier which is useful in conjunction with a data separator including a digital phase-locked loop.

BACKGROUND OF THE INVENTION

In some situations it is necessary to multiply the frequency of an input signal, e.g., an input clock signal. As described below, a case in point is a data separator which includes a digital phase-locked loop.

In digital communications systems, binary numbers are electronically represented by high and low voltage signals, transmitted through a single wire. For successful error-free communication, a receiver must extract both data and clock signals from the single-bit stream, and then sample the data using the extracted clock signal. To accomplish this, a phase-locked loop (PLL) is normally used to regenerate the desired clock signal and synchronize it with the received data bit stream. Data separators are used, for example, in controllers for floppy disk drives, where they synchronize a stream of data bits which are read from a magnetic storage disk.

Most conventional data separators use analog PLLs to generate the sampling clock signal. Analog PLLs have the potential of infinite resolution, but they require precise components, such as resistors and capacitors, either external or internal. These components are susceptible to variations in the manufacturing process. Furthermore, analog PLLs are susceptible to signal noise, which also limits their resolution in practical terms.

To avoid these disadvantages, digital PLLs have been developed. Digital PLL circuits do not require precision components. However, the resolution of a digital PLL circuit is limited to its effective sampling interval, which is the minimum interval at which samples may be taken. In order to increase the resolution of a digital PLL, a high-speed clock signal increments a counter to a preselected number, and the counter supplies sample clock pulses to a comparator for comparison with the received clock signal. For CMOS circuits, the sample clock signal must be relatively high (e.g., 100 MHz). In a digital PLL, the frequency of the high-speed clock signal is usually divided by an integer number, and the resulting clock signal is compared with the clock field of the received data signal.

The high-speed clock signal may be provided by an external source, an internal free-running oscillator, an internal voltage-controlled oscillator, or an internal digital-controlled oscillator. In the latter case, the digital-controlled oscillator is included in a digital frequency multiplier that is supplied with a relatively slow reference clock. Economically, it is normally preferable to frequency multiply an available slow clock signal rather than to use an external high-speed clock signal directly.

Prior art data separators utilizing digital-controlled oscillators have suffered from accuracy and stability problems. These problems are greatly reduced using the frequency multiplier of this invention.

SUMMARY OF THE INVENTION

In the frequency multiplier of this invention, a relatively slow oscillatory signal (e.g., a clock signal) is delivered to a divide-by-K unit, and the output of a ring oscillator is delivered to a divide-by-N unit, with N being greater than K. The outputs of the divide-by-K unit and the divide-by-N unit are delivered to respective inputs of a frequency comparator. The output of the frequency comparator is used to generate coarse and fine tuning signals, which are sent to the ring oscillator. The output of the ring oscillator is a frequency-multiplied high-speed oscillating signal.

When the output of the divide-by-N unit is at a frequency which is different from an output of the divide-by-K unit, the frequency comparator generates tuning signals which are delivered to the ring oscillator. When the frequency comparator indicates a match between the frequencies of the signals at its inputs, the digital frequency multiplier is locked and delivers an output signal which has a frequency greater than the input signal by a factor equal to N divided by K. In the preferred embodiment, the coarse tuning signal increases the frequency of the ring oscillator until the frequency delivered by the divide-by-N unit exceeds the frequency of the signal from the divide-by-K unit, and then the fine tuning signal decreases the frequency of the ring oscillator until a match within desired limits is achieved.

In accordance with another aspect of this invention, the ring oscillator includes a plurality of delay elements, each of which has a characteristic delay. The delay elements are connected in a "ring" configuration. When the oscillator is enabled, a signal circulates around the ring at a rate which is determined by the combined delays of the delay elements. The frequency of the oscillator is varied, in the coarse tuning phase, by subtracting or adding delay elements from or to the ring, thereby increasing or decreasing the frequency of oscillation. The fine tuning of the ring oscillator is performed by adjusting a variable delay element (e.g., a parallel arrangement of tri-state inverters) which is connected between two of the gates.

BRIEF DESCRIPTION OF THE DRAWINGS

This invention may be more fully understood by reference to the following detailed description and the following drawings, in which.

DESCRIPTION OF THE INVENTION

The fully-digital frequency multiplier of this invention is a multi-purpose unit which, as noted above, may advantageously be used to provide a "fast" clock signal to a data separator in the interface circuitry of a floppy disk controller. In a floppy disk controller, the serial data stream which flows from the magnetic recording medium during the read operation includes data and clock information. The job of a data separator is to separate the data from the clock. In addition, the data separator produces a "read" clock that locks to the data rate and follows the relatively slow data rate changes caused by the disk drive motor, but does not track instantaneous bit jitter. In a digital data separator, the resolution of the data separator is a function of the sampling rate provided by the "fast" clock input. A high-speed clock input to the data separator increases the sampling rate and therefore the resolution of the data separator. A high-frequency clock can advantageously be obtained by frequency-multiplying a relatively slow reference clock.

Figure 1:
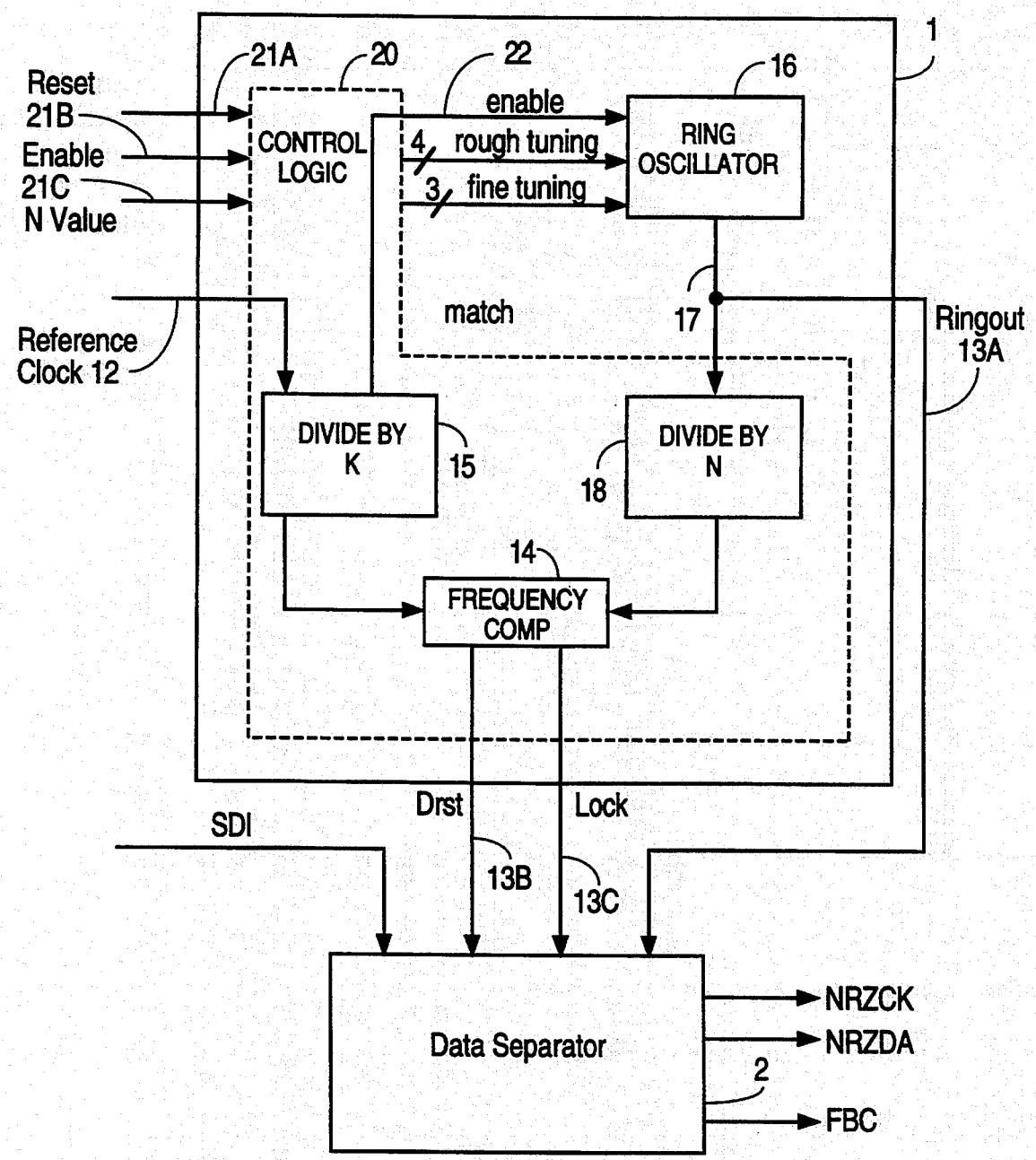
FIG. 1 illustrates a block diagram of the digital frequency multiplier of this invention, together with a data separator.

Such an arrangement is illustrated in the block diagram of FIG. 1, which includes a frequency multiplier 1 and a data separator 2. Frequency multiplier 1 is supplied by a relatively slow reference clock signal on an input line 12 and produces a frequency-multiplied clock signal designated Ringout on an output line 13A, a reset signal designated Drst on an output line 13B, and a Lock signal indicating that frequency multiplier 1 is locked to a frequency on an output line 13C. All of these output signals are delivered to data separator 2. As outputs, data separator 2 delivers a non-return-to-zero clock signal (NRZCK), a non-return-to-zero data signal (NRZDA), and a full bit cell clock signal (FBC). Data separator 2 is described in detail in the above-referenced application Serial No. 08/221,618.

Frequency multiplier 1 includes a control logic unit 20 and a ring oscillator 16. Control logic unit 20 receives control inputs on lines 21A, 21B and 21C. Control logic unit 20 further includes a frequency comparator 14, a divide-by-K unit 15 and a divide-by-N unit 18. Frequency comparator 14 compares the frequencies at the outputs of divide-by-K unit 15 and divide-by-N unit 18, respectively. The output of ring oscillator 16 on a line 17 is also the output of frequency multiplier 1, which is sent via line 13 to data separator 2. The input on line 21A is a master reset signal, the input on line 21B is an activity enable signal, and the input on line 21C determines the value of N in divide-by-N unit 18.

Frequency comparator 14 delivers an output representing the relative frequencies supplied by divide-by-K unit 15 and divide-by-N unit 18, respectively. Control logic unit 20 delivers three control signals to ring oscillator 16: an enable signal on a line 22, a coarse tuning signal on a line 23, and a fine tuning signal on a line 24. As indicated in the drawing, line 23 carries four bits and line 24 carries three bits.

The frequency multiplication function of frequency multiplier 10 is provided by the fact that N is greater than K (both N and K are normally integers). Thus, the frequency of the output of ring oscillator 16, which appears as the Ringout signal, is necessarily greater than the frequency of the reference clock input on line 12. The multiplication factor provided by frequency multiplier 11 is equal to N divided by K.

Figure 2:
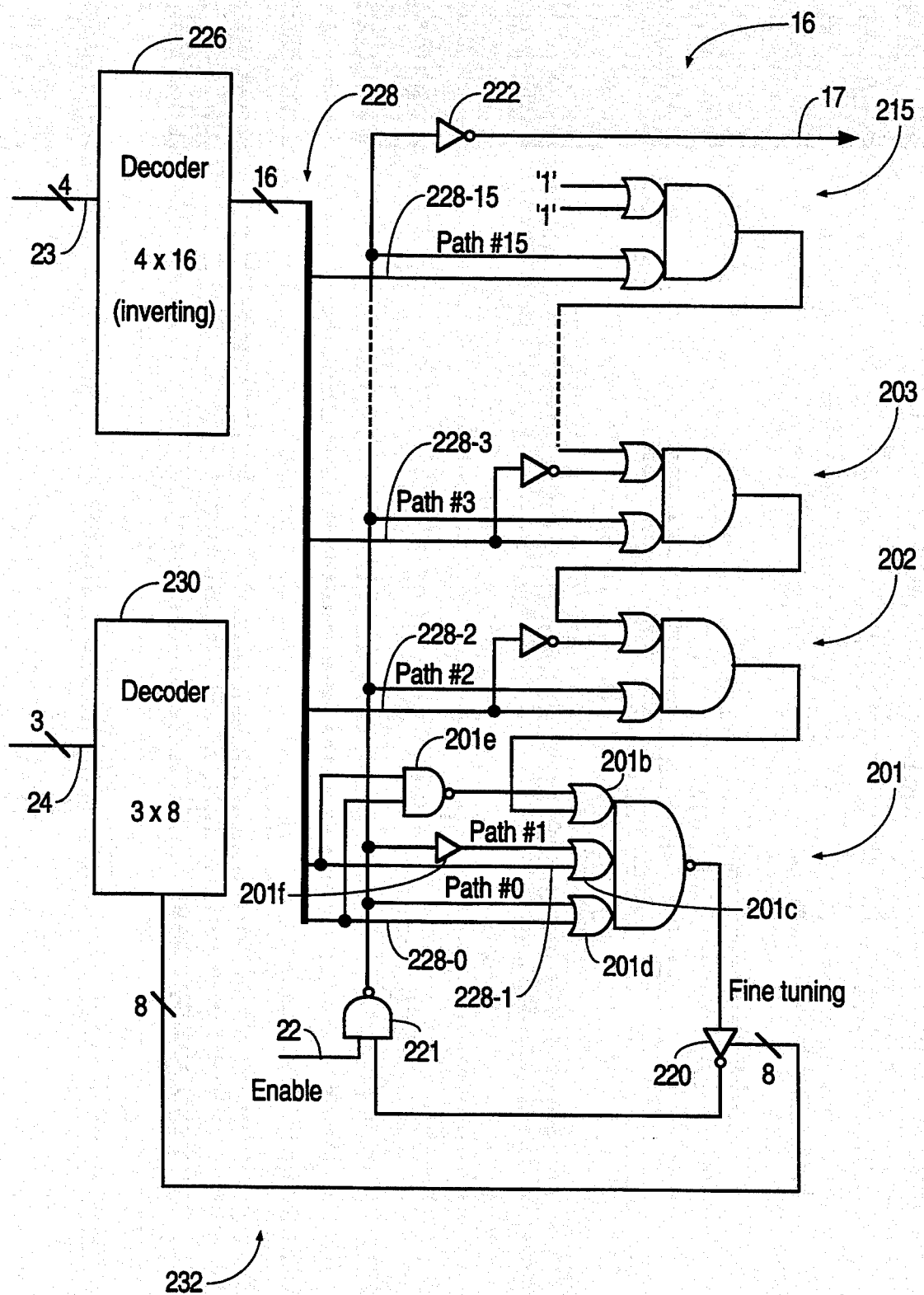
FIG. 2 illustrates a logic diagram of a preferred embodiment of the ring oscillator.

The structure of ring oscillator 16 is illustrated in the logic diagram of FIG. 2. Ring oscillator 16 includes fifteen AND-OR gate combinations which are designated 201, 202, 203, . . . 215. Gate combinations 201 through 215 are connected into a plurality of "rings" which are designated by Paths numbered 0, 1, 2, 3 . . . 15. Also included in each of Paths #0 through #15 are a variable delay element 220 and a NAND gate 221, which is supplied at one input by the enable signal on line 22. The output of NAND gate 221 is connected to the inputs of gate combinations 201 through 215 and via an inverter 222 to line 17, which is the output of ring oscillator 16.

A decoder 226 receives an input from 4-bit line 23, and delivers an active low output on sixteen lines 228, which are connected to the inputs of gate combinations 201 through 215. Lines 228 include a line 228-0 associated with Path #0, a line 228-1 associated with Path #1, and so forth. Since the output of decoder 226 is inverted, only one of the sixteen lines 228 which is designated by decoder 226 is in a low logic state. The rest of lines 228 are in a high logic state.

A decoder 230 receives a 3-bit input on line 24 and delivers an output on one of eight lines 232, which are connected to the respective inputs of variable delay element 220.

It will be noted that each of Paths #0 through #15 includes an odd number (3) of inverting units: gate combination 201, variable delay element 220, and NAND gate 221. Thus, when each of these components is enabled, a given logic pulse will cycle through these elements repeatedly at a frequency dependent upon the combined delay of the elements. Moreover, since none of the gate combinations 202 through 215 are inverting, the same result will obtain if a pulse is cycled through one of these paths. As additional ones of gate combinations 202 through 215 are connected into the ring, the frequency of the oscillation will decrease as a result of the delay inserted by the additional gate combinations.

Figure 3:
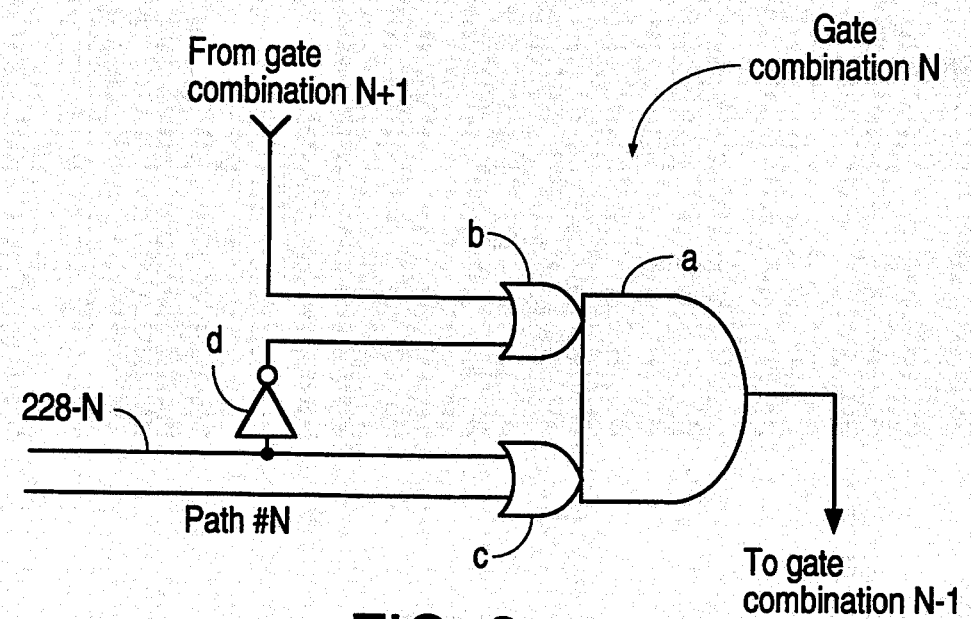
FIG. 3 illustrates a detailed view of a gate combination in the ring oscillator.

The logic elements shown in FIG. 3, designated gate combination N, represent a single one of gate combinations 202 through 214, and include an AND gate designated "a" having two inputs connected to the outputs of OR gates designated "b" and "c" respectively, and an inverter designated "d". The output of inverter "d" is connected to one of the inputs of OR gate "b" and the input of inverter "d" is connected to one of the inputs of OR gate "c".

This gate combination acts like a selector. When the control signal on line 228-N, which is at the control input of OR gate "c" is logic low, then a signal in the input Path #N, which is at the other input of OR gate "c", flows through the gate combination N to the output of AND gate "a". When the control signal on line 228-N is logic high the output of inverter "d" which is at the control input of OR gate "b" is low and a signal from the output of gate combination N+1, which is at the other input of OR gate "b" flows through gate combination N The gate combination N adds a delay to the signal flowing through it.

As shown in FIG. 2, the structure of gate combination 215 is slightly different. Gate combination 215 does not include an inverter "d" since the input of gate combination 215 does not connect to another gate combination. When gate combination 215 is selected, the control signal on line 228-15 is a logic low, and the control signals on lines 228-0 through 228-14 are not active and therefore logic high. A signal in Path #15 flows through gate combination 215 with a delay. The output of gate combination 215 flows through gate combination 214, and so forth, until it passes through gate combination 201.

Similarly, when the control signal on line 228-14 is logic low, a signal in Path #14 flows through gate combination 214, and then through gate combination 213, gate combination 212, and so forth, until it passes through gate combination 201. The same occurs when any one of gate combinations 202 through 213 are selected by delivering a logic low to one of lines 228-2 through 228-12, respectively.

Figure 4:
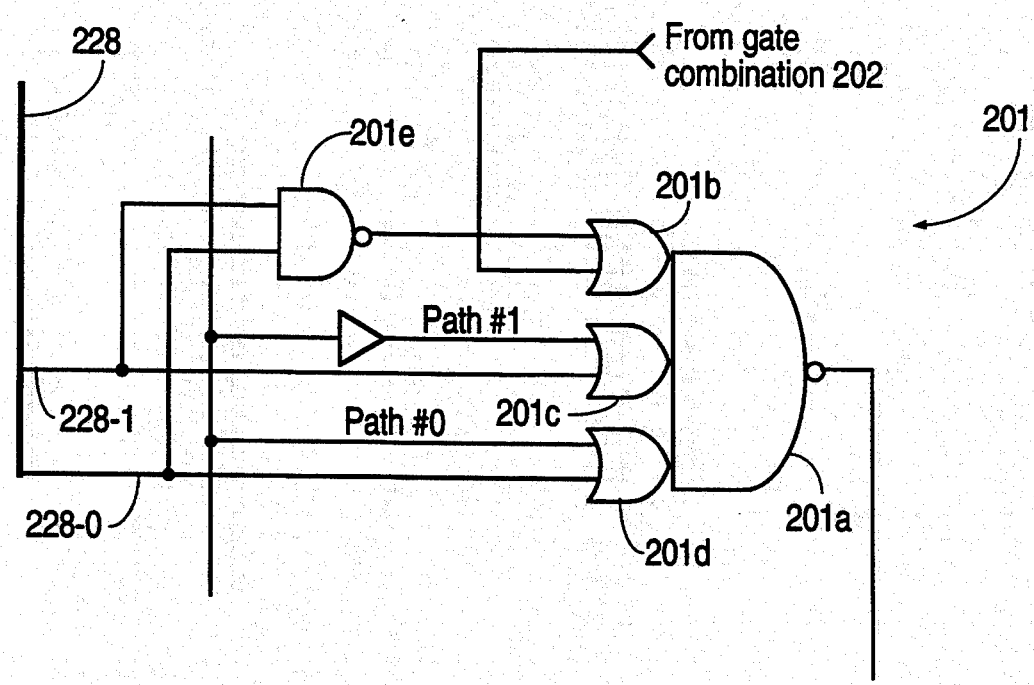
FIG. 4 illustrates a detailed view of a second gate combination in the ring oscillator.

FIG. 4 illustrates a detailed view of gate combination 201. Gate combination 201 includes a NAND gate 201a which has three inputs supplied, respectively, by an OR gate 201b, an OR gate 201c and an OR gate 201d. One input of each of OR gate 201b, OR gate 201c and OR gate 201d acts as an active low control input, and the other input acts as a data input. Only one of the three control inputs is active at a given time. The control input of OR gate 201b is supplied by a NAND gate 201e, which has inputs connected, respectively, to lines 228-0 and 228-1. The data input of OR gate 201b is connected to the output of gate combination 202. The control input of OR gate 201c is connected to line 228-1, and the data input of OR gate 201c is connected to the output of a buffer gate 201f, which is a part of Path #1. The control input of OR gate 201d is connected to line 228-0, and the data input of OR gate 201d is part of Path #0. When the control input of one of OR gates 201b, 201c or 201d is a logic low (i.e., active), a signal at the data input of such OR gate flows through the OR gate and through NAND gate 201a. In the course of flowing through the OR gate and NAND gate 201a, the signal is delayed and inverted.

Referring again to FIG. 2, when Path #0 is selected by a logic low on line 228-0, a signal flows through OR gate 201d and through NAND gate 201a, being delayed and inverted in the process. When Path #1 is selected by a logic low on line 228-1, a signal flows through buffer gate 201f, where it is delayed, and then it flows through OR gate 201b and through NAND gate 201a, being delayed again and inverted. When neither Path #0 nor Path #1 is selected, lines 228-0 and 228-1 are at a logic high (i.e., they are not selected by decoder 226), the output of NAND gate 201e is logic low. Therefore, the control input of OR gate 201b is logic low, and a signal at the data input of OR gate 201b, which is connected to the output of gate combination 202, flows through OR gate 201b and NAND gate 201a, being delayed and inverted in the process. Buffer gate 201f has a delay which is less than the delay of gate combination 202. Accordingly, the oscillation frequency represented by Path #1 is intermediate between the frequencies associated with Path #0 and Path #2, respectively.

Variable delay element 220 provides fine tuning. As shown in FIG. 1, variable delay element 220 includes, in this embodiment, eight tri-state inverters 220A–220H, with all of their inputs connected together and with all of their outputs connected together. Tri-state inverters 220A–220H differ slightly from each other in their driving capabilities, thus providing very small variations in delay. Only a single tri-state inverter is selected at a given time. Preferably, the range of delays provided by variable delay element 220 is approximately equal to the difference in the delays provided by gate combinations 202 through 215.

To summarize the operation of ring oscillator 16, an output of decoder 226 goes low to select a particular one of Paths #0 through #15. When an enable signal appears on line 22, a signal oscillates through ring oscillator 16 at a frequency that is determined by the number of delay elements in the selected path. The frequency of ring oscillator 16 is fine tuned by an output of decoder 230, which controls the delay provided by variable delay element 220.

As an alternative to variable delay element 220, a number of identical tri-state inverters could be connected in parallel. The delay is reduced by selecting additional tri-state inverters. Each additional tri-state inverter selected increases the driving capability of the parallel combination and therefore reduces its delay. This arrangement requires decoder 230 to have the capability of selecting more than one tri-state inverter at a time.

Frequency multiplier 10 is preferably formed by a CMOS process in an integrated circuit chip.

Figure 5:
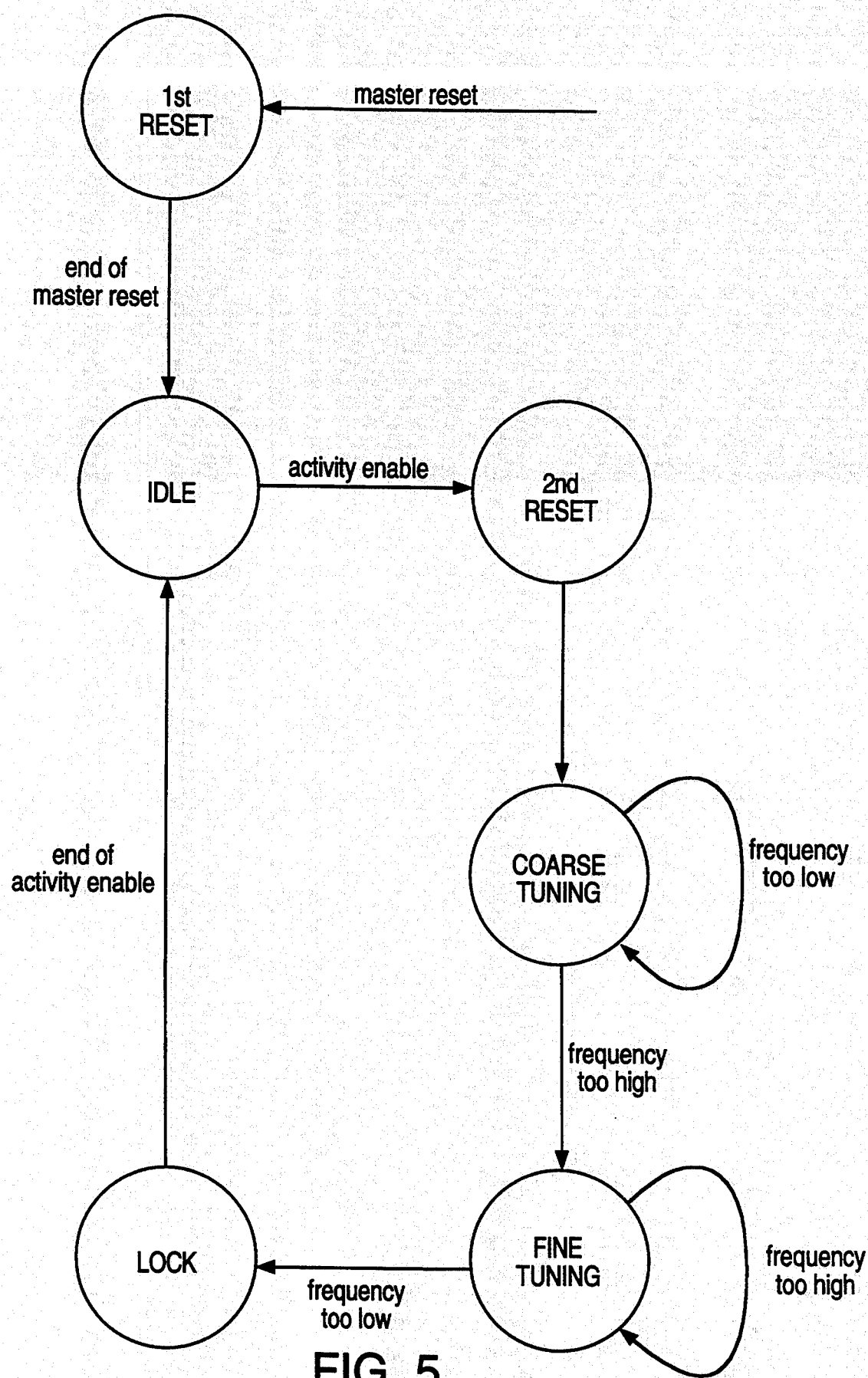
FIG. 5 illustrates a flow diagram of the state machine in control logic unit.

The operation of frequency multiplier 1 is controlled by a state machine which is formed within control logic unit 20. The state machine within control logic unit 20 has the six stages illustrated in FIG. 5: a First Reset Stage, an Idle Stage, a Second Reset Stage, a Coarse Tuning Stage, a Fine Tuning Stage, and a Lock Stage.

In the First Reset Stage, the master reset signal on line 21A is a logic high, and frequency multiplier 10 goes through a reset procedure. Control logic unit 20 delivers the binary word 1111 over line 23, which causes decoder 226 to select Path #15 by causing line 228-15 to go to a logic low. AS described previously, this causes all of gate combinations 201 through 215 to be included in the "ring" of ring oscillator 16 and causes ring oscillator 16 to oscillate at the lowest frequency.

Simultaneously, control logic 20 delivers the binary word 000 over line 24, which causes decoder 230 to select the lowest delay tri-state inverter within variable delay unit 220. Thus, the lowest coarse-tuning frequency and the highest fine-tuning frequency of ring oscillator 16 are selected. Moreover, the circuitry is arranged such that the frequency received by frequency comparator 14 from divide-by-N unit 18 is lower than the frequency received from divide-by-K unit 15. When the master reset signal on line 21A goes to a logic low, control logic unit 20 moves into the Idle Stage.

During the Idle Stage, ring oscillator 16 is disabled and no operations are performed.

When the activity enable signal on line 21B goes to a logic high, control logic unit 20 goes to the Second Reset Stage, and frequency multiplier 10 repeats the reset procedure that was described above. Upon entering the Second Reset Stage, frequency multiplier 1 generates the reset signal Drst on line 13B, which may be used to enable data separator 2. After four cycles of the reference clock on line 12, control logic unit 20 moves to the Coarse Tuning Stage.

At the beginning of the Coarse Tuning Stage, Path #15 is selected and the frequency of ring oscillator 16 is at its lowest value. Line 22, which is connected to an output of divide-by-K unit 15, carries an active signal which enables ring oscillator 16. When the signal on line 22 is at a logic high, ring oscillator 16 oscillates. When the signal on line 22 is at a logic low, frequency comparator 14 is enabled and performs a comparison between the frequencies received from divide-by-K unit 15 and divide-by-N unit 18, respectively.

Frequency comparator 14 delivers a "negative match" signal indicating that the frequency received from divide-by-N unit 18 is lower than the frequency received from divide-by-K unit 15. Control logic unit 20 then delivers a signal over line 23 which causes decoder 226 to select Path #14 (by causing line 228-14 to go low). When the signal on line 22 goes again to a logic high, the frequency of ring oscillator 16 is increased. When the signal on line 22 goes again to a logic low, a frequency comparison is again performed by frequency comparator 14. If a "negative match" signal is again delivered by frequency comparator 14, control logic unit 20 delivers a signal over line 23 which causes decoder 226 to select Path #13. This process continues until the frequency of ring oscillator 16 is increased to the point that a "positive match" indication is delivered by frequency comparator 14 (i.e., the frequency of ring oscillator 16 divided by N is higher than the frequency of the reference signal divided by K). Upon the "positive match" indication, control logic unit 20 goes to the Fine Tuning Stage.

During the Fine Tuning Stage, control logic unit 20 delivers an output over line 24 which causes decoder 230 to select progressively higher-delay tri-state inverters in variable delay unit 220, thereby decreasing the frequency of ring oscillator 16. After each new selection, the output of frequency comparator 14 is detected, and if a "positive match" indication is present, the next higher delay tri-state inverter in variable delay unit 220 is selected. This process continues until a "negative match" indication is again delivered by frequency comparator 14. At this point, the frequency of ring oscillator 16 is very close to the frequency of the reference signal divided K. The actual deviation from the frequency of the reference signal divided by K is determined by the difference between the delays inserted by the tri-state inverters within variable delay unit 220. The frequency multiplier may achieve an accuracy of, for example, 1%.

Upon locking to the target frequency, frequency multiplier 10 enters the Lock Stage, during which the signal on line 22 is kept at a logic high and a Lock signal is delivered on line 13C, indicating to data separator 2 that frequency multiplier 1 is locked on a frequency. Accordingly, during the Lock Stage, ring oscillator 16 is enabled and the path within ring oscillator is fixed. When the activity enable signal on line 21B goes inactive, the state machine returns to the Idle Stage.

Figure 6:
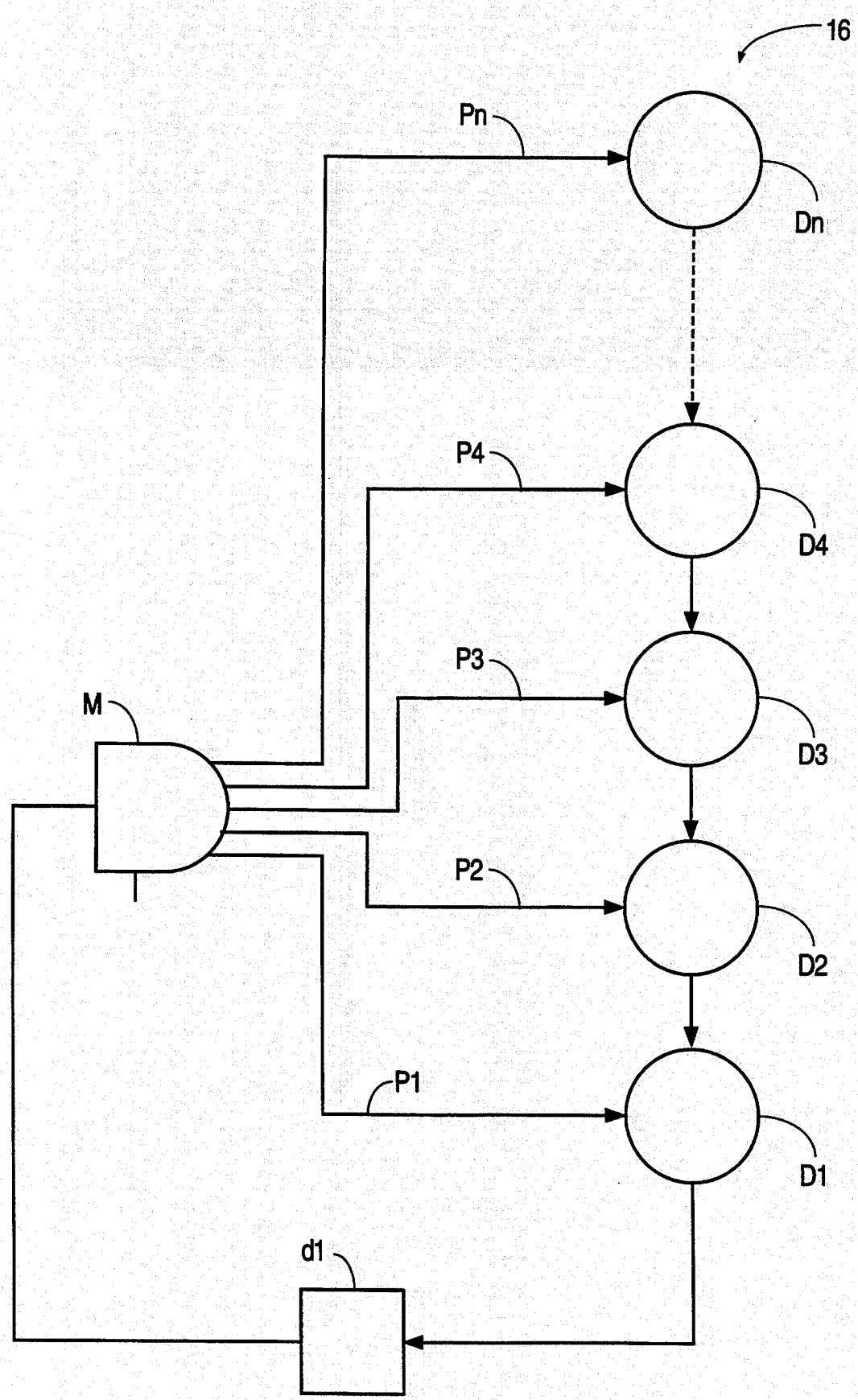
FIG. 6 illustrates a block diagram of the ring oscillator of this invention.
Figure 7:
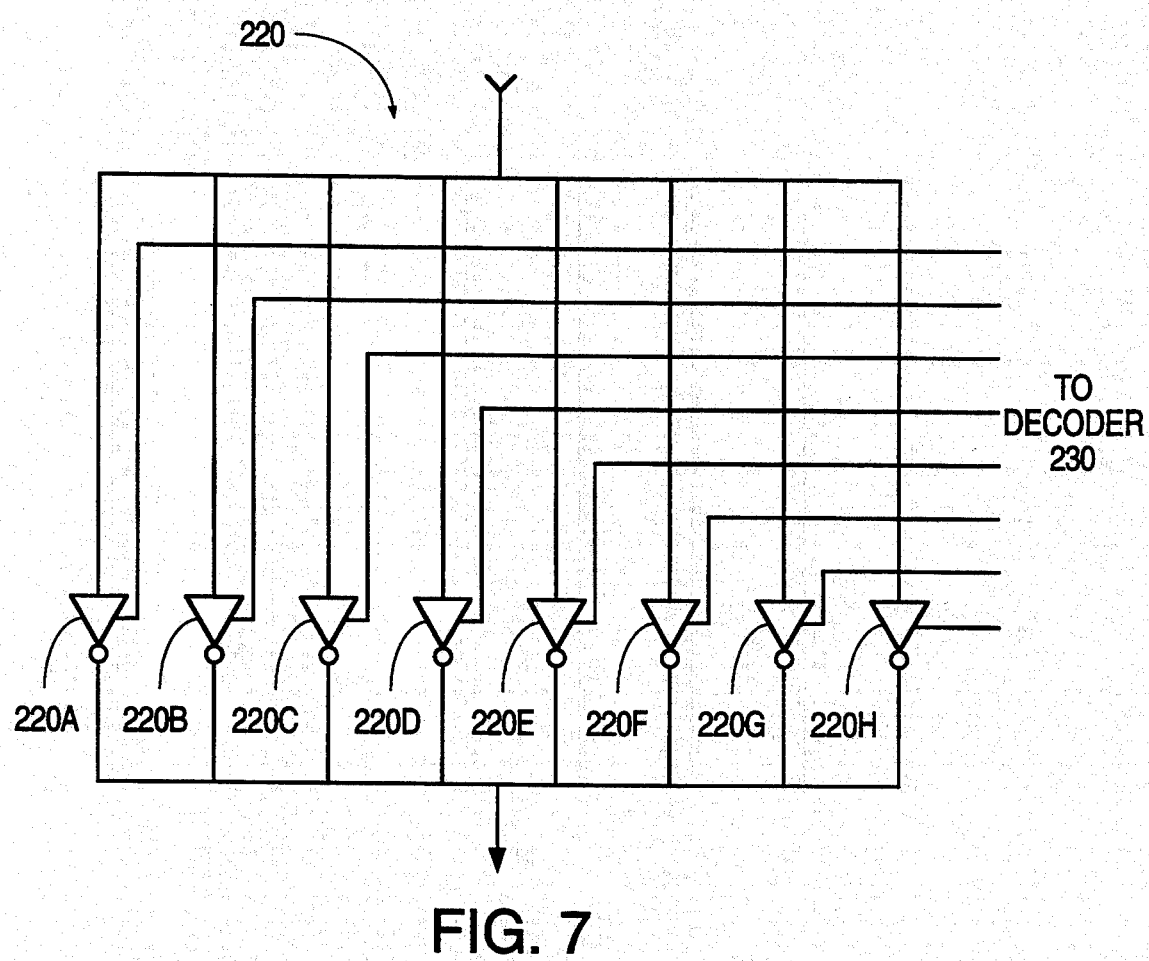
FIG. 7 illustrates a circuit diagram of the variable delay unit.

While a particular embodiment according to this invention has been described, it is apparent that numerous alternative embodiments can be devised by those skilled in the art. FIG. 6 illustrates a block diagram of ring oscillator 16. Reference numerals D1 through Dn represent delay elements that are connected in paths represented by P1 through Pn, respectively. A multiplexer M selects which of paths P1 through Pn is to be connected at a given time. A fine tuning element d1 is capable of inserting a variable delay into paths P1 through Pn. It will be apparent that ring oscillator 16 could be tuned by starting with path P1 and reducing its frequency by successively selecting paths P2, P3, etc., until the frequency falls below a reference frequency. Delay elements D1 through Dn could be any type of logic device or other component that is capable of inserting a delay into paths P1 through Pn.

It is intended that the scope of this invention, as defined in the following claims, include all such alternative embodiments.

We claim:

1. A frequency multiplier comprising:
   a control logic unit comprising a divide-by-K unit, a divide-by-N unit and a frequency comparator, respective outputs of said divide-by-K unit and said divide-by-N unit being connected to inputs of said frequency comparator; and
   a ring oscillator having an output connected to an input of said divide-by-N unit, said ring oscillator comprising a plurality of coarse delay units connected into a plurality of rings, a different number of said coarse delay units being connected in different ones of said plurality of rings, and a variable delay unit connected in all of said rings, a delay introduced by said variable delay unit being adjustable independently of said coarse delay units.

2. The frequency multiplier of claim 1 wherein said variable delay unit comprises a plurality of delay elements, each of said delay elements being capable of applying a different delay to a signal circulating in any one of said rings.

3. The frequency multiplier of claim 1 wherein said variable delay unit comprises a tri-state inverter.

4. The frequency multiplier of claim 3 wherein said variable delay unit comprises a plurality of tri-state inverters connected in parallel, an input of each tri-state inverter being connected to one of a plurality of outputs of a decoder.

5. The frequency multiplier of claim 4 wherein each of said tri-state inverters imposes a different delay.

6. The frequency multiplier of claim 4 wherein each of said tri-state inverters imposes the same delay.

7. The frequency multiplier of claim 1 wherein at least one of said coarse delay units comprises an AND gate and first and second OR gates, outputs of said first and second OR gates being connected to respective inputs of said AND gate, said first OR gate being connected into a circuit path of a first one of said rings, said second OR gate being connected into a circuit path of a second one of said rings.

8. The frequency multiplier of claim 7 wherein an input of said first OR gate is connected to an output of a decoder, and an input of said second OR gate is connected to said output of said decoder through an inverter.

9. The frequency multiplier of claim 1 further comprising a first decoder having a plurality of outputs, each of said plurality of outputs of said first decoder being connected to an input of one of said coarse delay units.

10. The frequency multiplier of claim 9 further comprising a second decoder having a plurality of outputs, each of said plurality of outputs of said decoder being connected to said variable delay unit.

11. A method of multiplying an input signal having a selected frequency to obtain an output signal having a frequency approximately equal to N/K times said selected frequency, said method comprising;
   (a) providing the frequency multiplier of claim 1;
   (b) delivering said input signal to an input of said divide-by-K unit;
   (c) selecting a ring in said oscillator containing n of said coarse delay units and setting said variable delay unit to have a delay m;
   (d) comparing frequencies output by said divide-by-K unit and said divide-by-N unit, respectively, in said frequency comparator;
   (e) selecting a ring in said ring oscillator containing fewer than n of said coarse delay units;
   (f) repeating step (d);
   (g) repeating steps (e) and (f) until said frequency comparator indicates that the frequency output of said divide-by-N unit is greater than the frequency output of said divide-by-K unit;

(h) increasing the delay provided by said variable delay unit;

(i) repeating step (d); and (j) repeating steps (h) and (i) until said frequency comparator indicates that the frequency output of said divide-by-N unit is lower than the frequency output of said divide-by-K unit.

12. The method of claim 11 wherein said frequency multiplier enters an idle state following step (j), said frequency multiplier consuming no power while in said idle state.

13. The method of claim 1 wherein the frequency output of said ring oscillator following step (j) is within 1% of said selected frequency multiplied by 14. A frequency multiplier comprising:

a control logic unit comprising a divide-by-K unit, a divide-by-N unit and a frequency comparator, respective outputs of said divide-by-K unit and said divide-by-N unit being connected to inputs of said frequency comparator; and a ring oscillator having an output connected to an input of said divide-by-N unit, said ring oscillator comprising:

a plurality of coarse delay units connected into a plurality of rings, a different number of said coarse delay units being connected in different ones of said plurality of rings, and a variable delay unit connected in all of said rings;

a first decoder connected to said rings, said first decoder for receiving a digital code from said control logic unit and providing an output to select one of said rings; and a second decoder connected to said variable delay unit, said second decoder for receiving a digital code from said control logic unit and providing an output to control a delay introduced by said variable delay unit.

15. The frequency multiplier of claim 14 wherein said variable delay unit comprises a plurality of delay elements, each of said delay elements capable of applying a different delay to a signal circulating in any one of said rings.

16. The frequency multiplier of claim 15 wherein said delay elements are connected in parallel.

17. The frequency multiplier of claim 15 wherein said variable delay unit comprises a tri-state inverter.

* * * * *

UNITED STATES PATENT AND TRADEMARK OFFICE
CERTIFICATE OF CORRECTION

PATENT NO.   :   5,438,300
DATED        :   August 1, 1995
INVENTOR(S)  :   Rami Saban, Avner Efendovich and Varda Karpati It is certified that error appears in the above-identified patent and that said Letters Patent is hereby corrected as shown below:

Col. 9, line 19, Claim 13, after "by" insert --N/K--.

Signed and Sealed this

Sixteenth Day of January, 1996

Attest:

BRUCE LEHMAN

*Attesting Officer*       *Commissioner of Patents and Trademarks*